United States Patent [19]

Yeap

[11] 4,118,601
[45] Oct. 3, 1978

[54] SYSTEM AND A METHOD FOR EQUALIZING AN AUDIO SOUND TRANSDUCER SYSTEM

[75] Inventor: Arthur K. C. Yeap, San Francisco, Calif.

[73] Assignee: Audio Developments International, Palo Alto, Calif.

[21] Appl. No.: 744,635

[22] Filed: Nov. 24, 1976

[51] Int. Cl.$^2$ .............................. H03J 5/24
[52] U.S. Cl. ............................ 179/1 D; 179/1 AT
[58] Field of Search .................. 179/1 D, 1 AT, 1 FS

[56] References Cited

U.S. PATENT DOCUMENTS

| 3,256,391 | 6/1966 | Boner | 179/1 FS |
| 3,732,370 | 5/1973 | Sacks | 179/1 D |

OTHER PUBLICATIONS

John G. Proakis, "Adaptive Digital Filters for Equalization of Telephone Channels", IEEE Transactions AU-18, No. 2, 6/1970, pp. 195-200.

Primary Examiner—Kathleen H. Claffy
Assistant Examiner—Kenneth A. Chayt
Attorney, Agent, or Firm—Lowhurst & Aine

[57] ABSTRACT

A system and a method of electronically equalizing the composite transfer function of a sound system and a room which receives the sound generated by the sound system. A test signal, such as white or pink noise, is applied to the sound system and a microphone for receiving the reference sound is placed in the room and has its output applied to an equalizer which comprises a plurality of contiguous narrow band filters covering the entire audio band. Each output signal from the filters is applied through an adjustable amplitude control means to a detector and each detected output signal is compared with a reference signal, such as the detected output signal from a selected mid-range filter and has its amplitude adjusted to provide a desired relationship with respect to the reference signal. After adjustment of the equalizer, the test signal and the microphone are disconnected from the system and the sound signal source is applied through the equalizer to the loudspeaker system.

4 Claims, 2 Drawing Figures

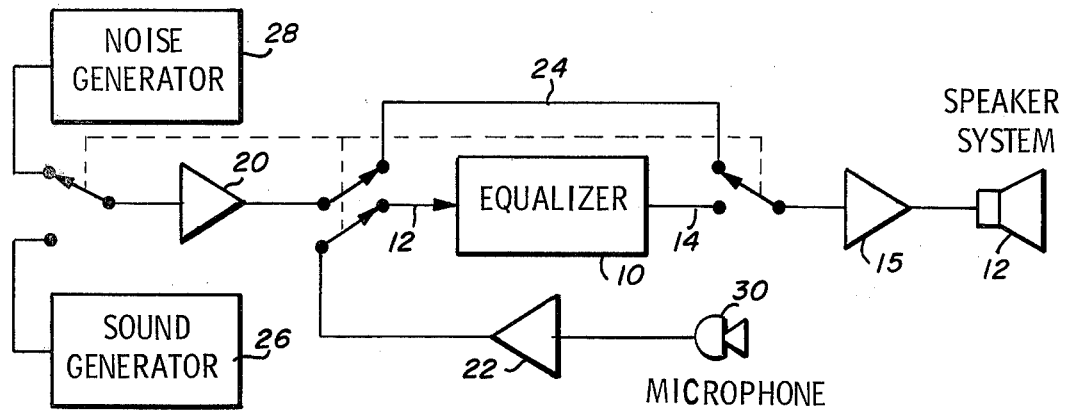
Fig_1
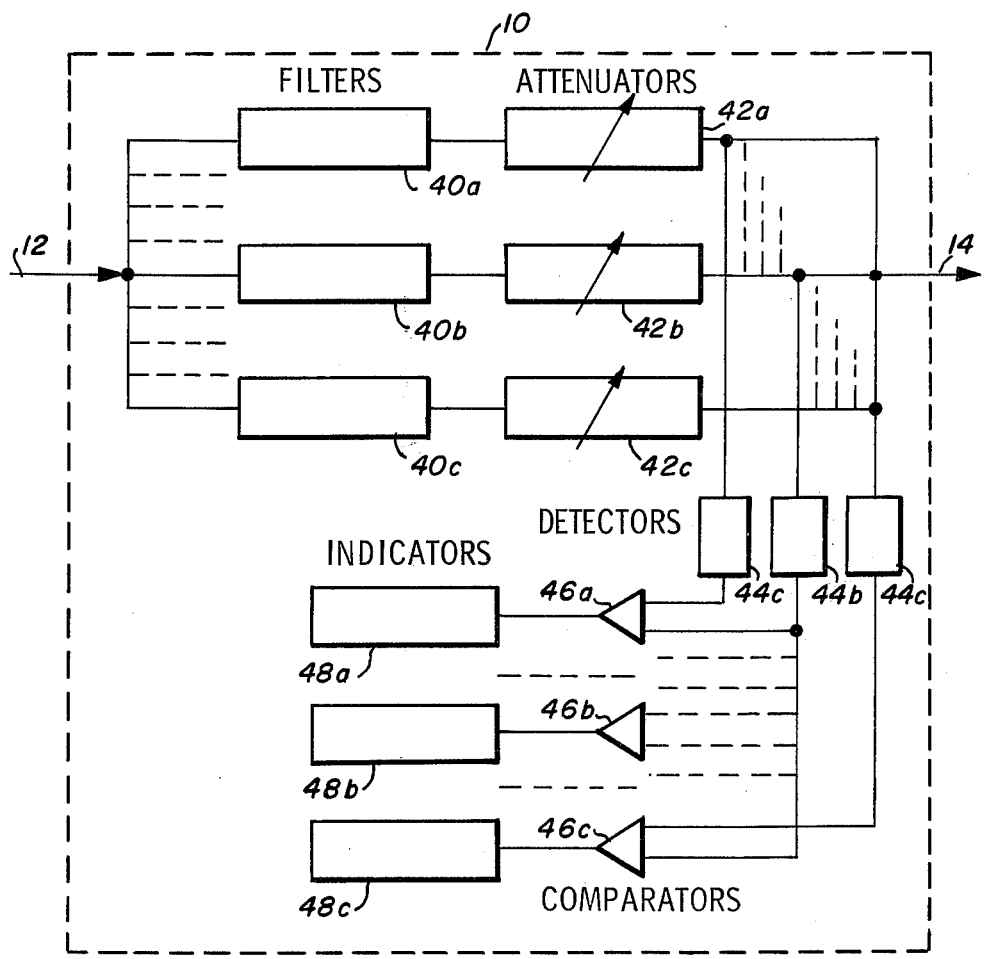
Fig_2

SYSTEM AND A METHOD FOR EQUALIZING AN AUDIO SOUND TRANSDUCER SYSTEM

BACKGROUND OF THE INVENTION

In the art of high fidelity sound generating systems it has long been recognized that power amplifiers and loudspeaker systems should have a substantially flat frequency response over the desired operating audio spectrum. High grade amplifiers are available commercially which satisfy this criteria and are generally known to have sufficient power and flatness over the spectrum to satisfy the most descriminating requirements. However, the sound transducer system, namely the speaker system, which radiates the audio frequency into the room environment usually does not satisfy the flatness criteria. In a high fidelity sound transducing system, it is not uncommon for the speaker system to cost more than the amplifier and related electronics. Additionally, the perception of sound is not only a function of speaker flatness but also the combination between speaker and room.

It is now well recognized that, unless the sound system is equalized to the room environment, room effects, such as resonant conditions or reflections, can unduly amplify or suppress certain sound frequencies generated by the source in a manner not anticipated by the designer or acceptable to the user.

Prior art systems have attempted to solve the problem of less than perfect amplifiers, less than perfect speaker systems, and less than perfect matching of speaker systems to room environment by applying a test signal to the sound transducer system, including an equalizer, which radiates a band of either white or pink noise into the room. The equalizer in such a system comprises a plurality of contiguous narrow filters covering the entire audio band and an adjustable amplitude control device associated with each filter. There was also provided a microphone whose output was applied to some sort of spectrum analyzer to give a display which is observed by an operator and who can plot frequency versus amplitude curve over the entire audio spectrum. The operator would then adjust each of the amplitude control devices in the system to obtain a flat response over the whole spectrum as observed on the panoramic display device.

The disadvantage of this system is that it requires some spectrum analyzer for adjustment which is very expensive and which has to be brought in for each adjustment or readjustment which is not always convenient. Further, such adjustment requires a skilled artisan that could observe and plot the response curves and make the appropriate adjustment. Finally, there was never any assurance that the filters in the spectrum analyzer were the equivalent of the filters in the equalizer and therefore equalization was often inaccurate.

SUMMARY OF THE INVENTION

The present invention overcomes the deficiencies of the prior art by providing an equalizing system and method which is less costly, more time saving, more convenient and more accurate than the prior art system discussed above. More specifically, the present invention does not require a spectrum analyzer and there is no need for plotting an amplitude versus frequency graph in order to make appropriate adjustments of the channel amplitude. Also the filters in the equalizer of this invention are used to analyze the response and to make the adjustments.

In accordance with the present invention, an equalizer is provided which initially serves as a means for analyzing and adjusting the signal level from each filter channel from a contiguous set of filters spanning the entire range of the frequency of interest, and thereafter as an equalizer means through which the sound signal is passed from the sound signal generator, such as a microphone, tape recorder or the like, to the speaker system. The equalizer includes a plurality of contiguous narrow band filters and the output of each filter is passed through an amplitude control device such as an attenuator. The outputs of the amplitude control devices are detected and the resulting DC signals are applied to a series of comparator circuits where the output is compared with the reference output, such as a selected filter output signal such as the output from this mid-band frequency, such as 1 KHz. The output signal from the comparators can be applied either to a voltage meter or to an indicator which gives an indication if the signal is outside a selected range.

In any case, the output of the comparator is used to adjust the amplitude control device of the respective channel until the meter reading, or indicator output, assumes a desired value or range. After the amplitude control device of each channel is set to provide compared signals of a selected value, the input signal to the equalizer is changed to the sound signal, and the output of the equalizer, which was not used during the equalizer adjustment procedure, is applied to the loudspeaker system to provide an equalized sound system.

BRIEF DESCRIPTION OF THE DRAWINGS

FIG. 1 shows a typical sound system in accordance with the present invention in schematic block diagram form, including the switching system to change from test or adjustment mode to operating mode; and FIG. 2 is a schematic block diagram of a preferred embodiment of the equalizer of this invention, illustrating three channels in detail and additional channels if desired.

DETAILED DESCRIPTION OF THE INVENTION

Referring now to the drawings, and particularly to FIG. 1 thereof, there is shown the entire sound transducer system of the invention. The heart of the system is equalizer 10 which has an input line 12 and an output line 14. Output line 14 is connected via switch S1 to a loudspeaker system 16 through an amplifier means 18 such as a power amplifier. Loudspeaker system 16 is generally inside a room and a match between the speaker system and the room is desired.

Input line 12 is connected to one pole of a switch S2 which connects either an amplifier 20 or an amplifier 22 to the equalizer 10. Another pole of switch S2 is connected to a bypass line 24 so that amplifier 20 can be connected directly to amplifier 18 without the amplifier signal having to go through equalizer 10. The sound signal which is normally applied to speaker system 16 is schematically shown as sound generator 26 which may be a microphone, a tape recorder, a phonograph, or any other type of device providing a sound signal. Sound signal generator 26 is connected to the input of amplifier 20 through switch S3. There is also provided a reference signal generator 28 which provides either white noise which is substantially flat, or pink noise (which is white with a 3DB per octave roll off.) Finally, a microphone 30 is connected to the input of amplifier 22.

Referring now to FIG. 2, there is shown, in block diagram form, an equalizer 10 constructed in accordance with the present invention. Input line 12 is connected to a plurality of filters of which only three are shown, namely 40a, 40b and 40c. The plurality of filters usually cover the band of the sound frequency of interest and each filter is a narrow band pass filter. Assuming that the plurality of filters is ten, then the following table illustrates the pass band and the center frequency of the ten filters.

| Pass Band in Hz | | | Center Frequency in Hz |
|---|---|---|---|
| 22.05 | – | 44.1 | 31.5 |
| 44.1 | – | 88.2 | 63 |
| 87.5 | – | 175 | 125 |
| 175 | – | 350 | 250 |
| 350 | – | 700 | 500 |
| 700 | – | 1400 | 1000 |
| 1400 | – | 2800 | 2000 |
| 2800 | – | 5600 | 4000 |
| 5600 | – | 11200 | 8000 |
| 11200 | – | 22400 | 16000 |

The output signal from filters 40, also referred to as the filtered signals, are applied to some amplitude controlling means such as adjustable attenuators 42a, 42b and 42c which allow the amplitude of the filtered signal to be adjusted. The signals from the attenuators, also referred to as attenuated signals or equalized signals, are applied to a plurality of detectors, such as detectors 44a, 44b and 44c. The detectors are devices which derive DC signals or voltages of the attenuated signals also referred to as the detected signals. The detected signals are then applied to a plurality of comparators such as comparators 46a, 46b and 46c in such a way that each channel has an input into a corresponding comparator. The other signal that is applied to the comparator is common to all comparators, or groups thereof, and may be the detected signal from a selected channel such as the center channel, or perhaps another reference signal. In any case, the signal used for comparing with the various detected signals will be referred to as the reference signal.

In FIG. 2, the detected signal from the center channel is used as the reference signal and the detected signal from channel a and from channel c is compared with the detected signal from channel b. The output signal from the comparator, also referred to as the compared signal, is applied to a plurality of indicators, such as indicators 48a, 48b and 48c, which may comprise a voltmeter for giving a visual indication of the amplitude and the sign of the compared signal, i.e., the difference between the two signals applied to the comparator, or may comprise a pair of differently biased diode where one diode would become conductive when the applied signal is below a certain limit and another diode becomes conductive when the compared signal is above a certain limit. The attenuated or equalized signals are summed and applied to equalizer ouput level 14.

The operation of the invention will now be explained with the help of the drawings. Assume switches S1, S2 and S3, which are all ganged, to be in the position shown in FIG. 1 which is the analyzing and adjusting mode. This being so causes the noise signal from generator 28 to be applied, through amplifier 20, bypass lead 24, output amplifier 18, to speaker system 16. At the same time, microphone 30 picks up the signal transduced by speaker system 16 into the room, and applies this signal through amplifier 22 to equalizer 10. The output signal on lead 14 of equalizer 10 is not utilized in this mode during which the equalizer 10 is adjusted as will now be explained. The microphone generated signal applied to the equalizer is divided by filters 40 into a plurality of contiguous frequency band channels. The filtered signals are then passed through attenuators 42, detectors 44, and comparators 46. Assuming that it is desired to have the output of all channels to be of equal signal strength, attenuators 42 are adjusted such that indicators 48 show a compared signal substantially equal to zero, i.e. channel a is made equal to channel b and channel c is made equal to channel b. Of course, any desired differences between the output from the various channels to a selected channel or to some other reference signal may be set into the equalizer utilizing attenuators 42.

After attenuators 42 are adjusted to reflect a desired difference or uniformity between the various channels, the equalizer is ready for use in the operational mode. Switches S1, S2 and S3 are placed into the other switching position which disconnects noise generator 28, microphone 30 and bypass line 24 completely from the system. Instead, sound signal generator 26 has its output signal applied, through amplifier 20, equalizer 10, power amplifier 18, to speaker system 16 which is in the normal mode in which the device of the invention will operate.

Accordingly, the system of this invention can be changed from the analyzing and adjusting mode to the normal operating mode by a single switch. Further, the channel separation and the filters used for analyzing and adjusting are also used for equalizing so that errors or inaccuracies due to using one filter system for analyzing and adjusting and another filter system for equalizing are eliminated.

Also, the system is most convenient if minor adjustments or rebalancing is necessary. The system is switched to the analyze and adjust mode and appropriate adjustments to attenuators 42 are made. Even during the operation of the system in the normal mode, it is possible to note when a channel is not properly equalized since indicators 48 are operating at all times and lack of an indication of output from a particular channel indicates a malfunction.

What is claimed is:

1. A system for equalizing a sound transducer system, including a source of program signals and a speaker, with an environment which is to receive the sound generated by the sound transducer system, comprising:
   a plurality of contiguous, narrow, band filters substantially covering the band of spectral frequencies of the sound generated by the sound transducer system for filtering an applied signal into a plurality of filtered signals;
   means connected to the output of each filter for controlling the amplitude of each filtered signal and for providing a plurality of amplitude controlled signals;
   means responsive at all times to each individual amplitude controlled signal for detecting each amplitude controlled signal and for simultaneously providing a plurality of detected signals;
   means responsive at all times to each of said detected signals and a reference signal and operative to provide a plurality of comparison signals continuously, each being commensurate with the difference between one of said detected signals and said reference signal, whereby said comparison signals are produced when said system is passing program signals; and means for combining all of said amplitude controlled signals and for forming an equalized signal.

2. A system in accordance with claim 1 further comprising a switching means for selectively applying either a test signal to said speaker and a microphone transduced signal from said speaker to said band filters for individually adjusting said means for controlling the amplitude of each filtered signal in accordance with said comparison signals, or the program signals to said band filters and said equalized signal to said speaker.

3. A system is accordance with claim 2 in which said test signal is random noise.

4. The method of equalizing a sound system for a program signal with an environment which is to receive the program, using an equalizer between the program of said sound signal and the speaker for dividing the received signal into a plurality of channels each having a different frequency band and which includes individual adjustment means by which the amplitude of the signal in each channel can be adjusted, comprising the steps of:

applying a test signal to the speaker to generate a test sound in the environment; applying the output signal of a microphone, responsive to the test sound, to the equalizer;

simultaneously detecting the signal in each channel and comparing each of the detected signals with a selected detected signal;

adjusting the amplitude of each signal in each channel until all detected signals bear a preselected relationship to one another;

disconnecting the test signal from the speaker and the microphone output signal from the equalizer;

applying the program signal to the equalizer and the output signals from the equalizer to the speaker without making any changes to the individual adjustment means in each individual channel; and monitoring the equalization by simultaneously detecting the signals in each channel and comparing each of the detected signals with a selected detected signal while the program signal is applied to the equalizer.

* * * * *